United States Patent
Takigawa et al.

(10) Patent No.: US 6,850,549 B2
(45) Date of Patent: Feb. 1, 2005

(54) LIGHT SOURCE DEVICE FOR PUMPING SOLID-STATE LASER MEDIUM

(75) Inventors: Hiroshi Takigawa, Isehara (JP); Yuji Nishikawa, Yamanashi (JP); Masao Sato, Takatsuki (JP); Shinya Naito, Ichihara (JP); Ryusuke Miyata, Yamanashi (JP)

(73) Assignee: Fanuc Ltd., Yamanashi (JP)

( * ) Notice: Subject to any disclaimer, the term of this patent is extended or adjusted under 35 U.S.C. 154(b) by 0 days.

(21) Appl. No.: 10/200,756

(22) Filed: Jul. 24, 2002

(65) Prior Publication Data

US 2003/0031227 A1 Feb. 13, 2003

(30) Foreign Application Priority Data

Jul. 24, 2001 (JP) ........................................ 2001-223223

(51) Int. Cl.[7] ............................................... H01S 3/091
(52) U.S. Cl. .............................. 372/75; 372/43; 372/44; 372/45; 372/46; 372/47; 372/48; 372/49; 372/50; 372/34; 257/715; 257/716; 257/714
(58) Field of Search ............................. 372/34, 43–50, 372/75, 35; 257/714–716

(56) References Cited

U.S. PATENT DOCUMENTS

| | | | | |
|---|---|---|---|---|
| 5,105,429 A | * | 4/1992 | Mundinger et al. | 372/34 |
| 5,105,430 A | * | 4/1992 | Mundinger et al. | 372/35 |
| 5,311,530 A | * | 5/1994 | Wagner et al. | 372/36 |
| 5,495,490 A | * | 2/1996 | Rice et al. | 372/34 |
| 5,815,523 A | * | 9/1998 | Morris | 372/66 |
| 6,091,746 A | * | 7/2000 | Le Garrec et al. | 372/35 |
| 6,151,341 A | * | 11/2000 | Bull et al. | 372/35 |

FOREIGN PATENT DOCUMENTS

| | | | |
|---|---|---|---|
| DE | 101 08 557 | | 9/2001 |
| EP | 1 073 167 | | 1/2001 |
| JP | 07-202332 | | 8/1995 |
| JP | 09-181376 | | 7/1997 |
| JP | 10-209531 | | 8/1998 |
| JP | 2001-44555 | | 2/2001 |
| JP | 2001160649 | * | 11/2002 |
| WO | WO00/11717 | | 3/2000 |

OTHER PUBLICATIONS

H.–G. Treusch et al., High–Brightness Semiconductor Laser Sources for Materials Processing: Stacking, Beam Shaping and Bars, Jul. 2000, p. 601–614.

(List continued on next page.)

*Primary Examiner*—Don Wong
*Assistant Examiner*—Delma R. Flores Ruiz
(74) *Attorney, Agent, or Firm*—Staas & Halsey LLP

(57) ABSTRACT

A light source device for pumping a solid-state laser medium of a laser generator, which is compact and capable of economically using LD bars constituting the LD stack with easy maintenance. The light source device is constituted by a plurality of LD modules. Each LD module comprises a plurality of cooling devices on which LD bars are respectively mounted and connection plates on both sides thereof. The LD bars are stacked such that longitudinal directions thereof extend perpendicular to a stacking direction thereof. A desired number of LD modules are mechanically connected with each other using the connection plates to form the LD stack. A sealing member is intervened between confronting connection plates of adjacent LD modules, so that flow passages of coolant formed in the respective LD modules are continuously connected. The connection plates have functions of fixedly supporting the cooling devices of each LD module and electrically connecting the adjacent LD modules.

5 Claims, 5 Drawing Sheets

OTHER PUBLICATIONS

Brian J. Comaskey et al., High Average Power Diode Pumped Slab Laser, Apr. 1992, p. 992–999.
G.L. Harnagel, Large Laser Diode Arrays for High–Duty–Cycle Operation, Aug. 27, 1992, (entire document).
Brian J. Comaskey et al., "High Average Power Diode Pumped Slab Laser," *IEEE Journal of Quantum Electronics*, vol. 28, No. 4, Apr. 1992, pp. 992–996.
*Optronics*, vol. 193, Jan. 1998, pp. 93–97 (Fig. 5).
*Proceedings of 48$^{th}$ Laser Materials Processing Conference*, Sponsored by Japan Laser Processing Society, Mar. 17, 2000, pp. 19–23 (Fig. 2.).
Hiroshi Takigawa, et al., "Technologies in High–Power Laser Diode Arrays," *Laser Review*, Jan. 13, 2000, pp. 209–213.

* cited by examiner

LIGHT SOURCE DEVICE FOR PUMPING SOLID-STATE LASER MEDIUM

BACKGROUND OF THE INVENTION

1. Field of the Invention

The present invention relates to a light source device using semiconductor laser (laser diode) for pumping a solid-state laser medium of a high-power solid-state laser generator suitable for use in a laser machining apparatus.

2. Description of the Related Art

In recent years, a solid-state laser generator such as YAG laser is generally used in a laser machining apparatus for cutting, welding, etc. of metal and nonmetal material. A semiconductor laser (laser diode) as well as conventional lamps are adopted as a light source for pumping a solid-state laser medium of the laser generator.

The pumping by the laser diodes (LD) is expected to be mainly used in the near future in view of advantages thereof. Particularly, it is possible to make a wavelength of a pumping light substantially coincide with a light absorbing range of the solid-state laser medium in the LD pumping, to enhance efficiency of energy absorption of the solid-state laser medium. Thus, an electro-optical conversion efficiency of the laser generator not less than 10% is realized in the LD pumping, whereas a conversion efficiency in the conventional lamp pumping is approximately 3%. Accordingly, a size of the laser generator with the LD pumping can be greatly reduced.

Further, heat generation in the solid-state laser medium is suppressed in the LD pumping and therefore a thermal lens effect due to the heat is reduced to enhance quality of an output laser beam. In addition, since lives of the laser diodes are approximately ten times longer than lives of the conventional lamps, labor and cost for maintenance of the laser generator is greatly reduced.

On the above background, research and development on the LD pumping technology are strongly carried out, particularly to seek a high performance of the LD and an optimal arrangement of the LD pumping.

The research on the high performance of the LD is carried out on LD material and also how to solve a problem of heat generated in the LD in driving. It is difficult to solve the problem of heat since an efficiency of light emission of the LD is not greater than 50% at present and a driving power thereof not less than 50% is transferred into heat.

For example, in a case where an exiting light of 40W is emitted form a LD bar having length of 1 cm, heat not less than 40W is emitted from a small region of the 1 cm length on the LD bar. It has been proposed a technique of cooling the LD bar from immediately thereunder by a cooling device having minute flow paths inside, as proposed in Japanese Patent Publication No. 10-209531.

In this technique, a plurality of LD bars each mounted on the cooling device can be stacked to form a surface light source device to enhance a density of an output power of a light emitting region (a ratio of the output optical power to the light emitting region). As described, the high density of output power provides advantages in performance of the solid-state laser generator.

At present, two kinds of laser mediums of a slab type and a rod type are mainly used for the high-power solid-state laser generator, and an arrangement of a pumping light containment is adopted in pumping the solid-state laser medium of either type. The pumping light containment is an arrangement of containing the pumping light in a casing covered by high reflection surfaces for pumping the solid-state laser medium disposed in the casing, to enhance the efficiency of absorbing the pumping light by the laser medium. As an example of applying the pumping light containment to a solid-state laser medium of the slab type, a solid-state laser generator with LD pumping is known from Japanese Patent Publication No. 2002-134817.

In the pumping light containment, it is generally adopted an arrangement in which an emitting light form the LD is converged by converging means such as lens and the converged light is introduced into a casing from an opening formed on the casing. In this case, it is necessary to converge the emitted light from the LD to be as dense as possible for enhancing efficiency of containing the pumping light. Therefore, an arrangement of the laser diodes and an optical system for producing the pumping light of high density are required.

In general, divergence of the emitted light from a high-power LD bar is within an angle of 10 degree in a longitudinal direction of the LD bar and within an angle of 40 degree in a direction perpendicular to the longitudinal direction. The above angle of divergence is expressed on the basis of the full width at half maximum of angular distribution of light intensity. Thus, the divergence angle of the emitted light is small in the longitudinal direction of the LD bar and is large in the direction perpendicular to the longitudinal direction.

When stacking the LD bars to form a LD stack for use as a light source device, it is general to stack the LD bars in a direction perpendicular to the longitudinal direction thereof. With this arrangement, the stacking of the LD bars is carried out easily in conformity with structures of the cooling devices for cooling the LD bars. A divergence angle of emitted light from the LD stack is equivalent to the divergence angle of each LD bar, i.e., within an angle of 10 degree in a longitudinal direction and within an angle of 40 degree in the staking direction.

In using the light source device as a pumping light source for the solid-state laser medium, it is appropriate to arrange the pumping light source such that the stacking direction of the LD bars (perpendicular to the longitudinal direction thereof) is parallel to a longitudinal direction of the solid-state laser medium, and converge the divergence of the emitted light in the longitudinal direction of the LD bars by the converging means such as lens.

In the above arrangement of the pumping light source device, the following problems arise as the number of stacked LD bars increases.

The LD bars are stacked by stacking cooling devices on which the LD bars are mounted with sealing members made of rubber material intervened therebetween. In this case, it is necessary that the cooling devices have constant thickness for making stacking pitch of the LD bars constant, since the stacking pitch of the LD bars is substantially determined by the thickness of the cooling device. Also, if thickness of the respective cooling devices are slightly changed, the thickness of the LD stack formed by stacking the cooling devices supporting the LD bars are greatly changed.

For example, in a case of stacking fifty LD bars with a stacking pitch of 2 mm, the thickness of the LD stack is 100 mm. In this case, if thickness of each cooling device is reduced by 50 $\mu$m, the thickness of the LD stack constituted by the fifty LD bars is shortened by 2.5 mm. If a large number of cooling devices having reduced thickness are stacked, pressure applied to each of the sealing members is lowered to tend to cause leakage of the coolant.

In order to avoid the above problem, it can be supposed to arrange the LD stacks each constituted by LD bars of a small number to be independently. In this arrangement, however, conduits for flow passages of the coolant and wiring of leads for the LD bars are made complicated, and a nonradiative area (dead space) produced between the LD stacks is increased to an extent which can not be ignored, to fail in effectively pumping the laser medium. Further, if a LD bar in the LD stack is broken, the LD stack as a whole has to be exchanged with a new one, or the LD stack has to be disassembled to replace the broken LD bar with a new one. In the former way, a large number of useable LD bars are wasted in vain and in the latter way, it is difficult to specify the broken LD bar in a large number of stacked LD bars, and even if the broken LD bar is specified the broken LD bar can not be easily replaced with a new one.

SUMMARY OF THE INVENTION

An object of the present invention is to improve a light source device for pumping a solid-state laser medium of a laser generator to be capable of economically using LD bars constituting a LD stack with easy maintenance and have a compact structure.

A light source device of the present invention comprises a plurality of laser diode modules connected in series to form a laser diode stack. Each of the laser diode modules has cooling devices for cooling laser diode bars respectively mounted thereon and flow passage for supplying/discharging coolant to/from the cooling devices. The cooling devices are stacked such that longitudinal directions of the laser diode bars extend perpendicular to a stacking direction thereof. The laser diode modules further having connection plates for connecting/disconnecting adjacent laser diode modules, and continuously connecting the flow passages of coolant formed in the adjacent laser diode modules.

Each of the laser diode modules may have the connection plates on both sides thereof to electrically connect the adjacent laser diode modules in series. Also, each of the laser diode modules may have the connection plates on both sides thereof to fixedly supporting the stacked cooling devices in the laser diode module.

Each of the connection plates may have a concavity for receiving an outermost cooling device of the stacked cooling devices. With this arrangement, the outermost cooling devices of each laser diode module are held by the concavities and contribute to meet the following condition.

It is preferable that the laser diodes and the connection plates are arranged in the laser diode stack such that a value of 1−(NB/A) does not exceed 0.2, where N (N: an integer not less than two) representing the number of LD modules, A represents an area of a smallest rectangle enclosing an emitting region of the laser diode stack, and B represents an area of a smallest rectangle enclosing an emitting region of each laser diode module.

DETAILED DESCRIPTION OF THE PREFERRED EMBODIMENTS

Figure 1:
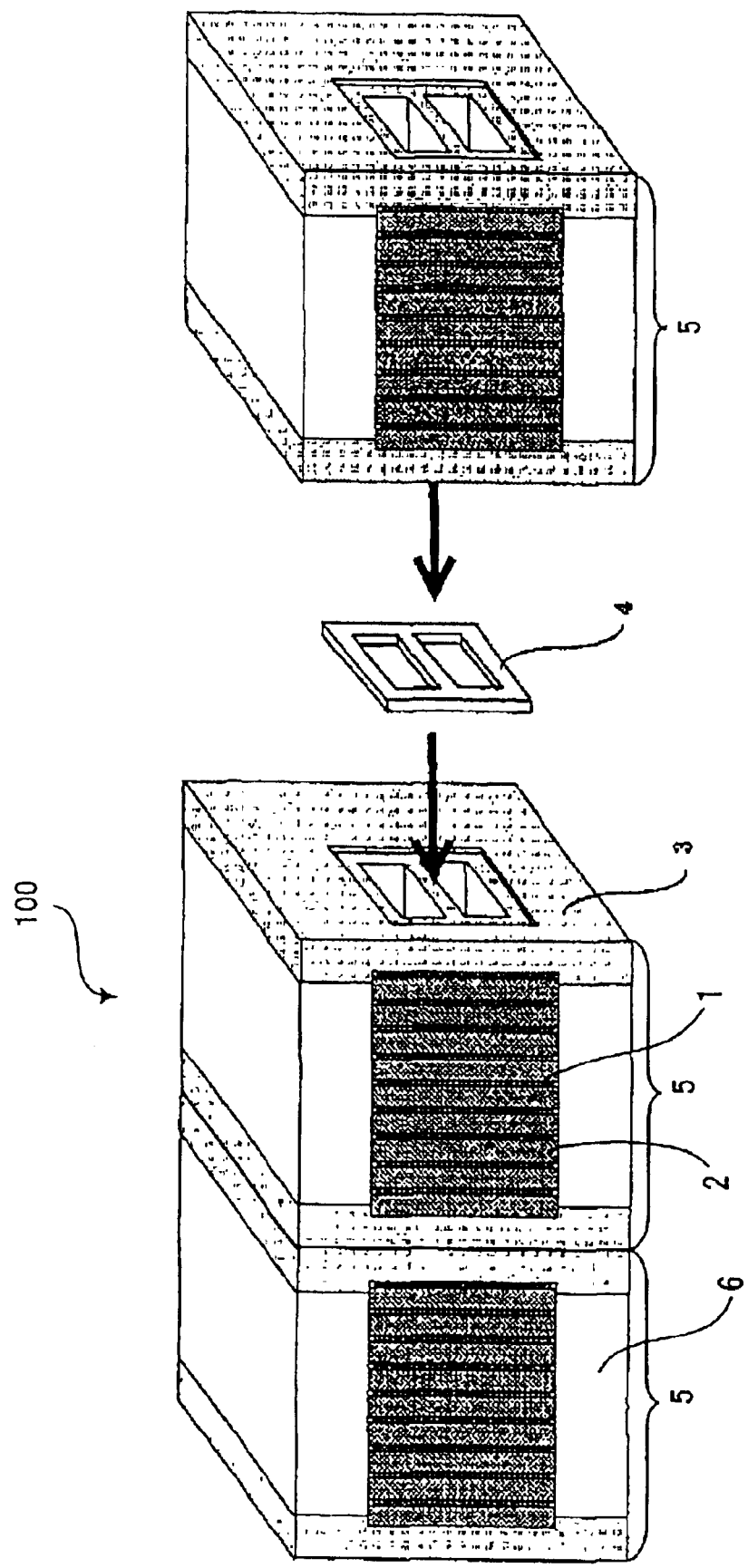
FIG. 1 is a partly exploded view of an LD stack for use as a pumping light source device according to an embodiment of the present invention.

A partly exploded view of FIG. 1 shows a fundamental arrangement of a LD stack for use as a light source device according to an embodiment of the present invention. In FIG. 1, an LD stack 100 comprises a plurality of LD modules 5 of which one LD module 5 is depicted separately form the rest of the LD modules 5 for the sake of illustration. Each of the LD modules 5 comprises a plurality of cooling devices 2 with LD bars 1 respectively mounted thereon, a housing 6 for supporting the cooling devices 2 with the LD bars 1 thereon and the connection plates 3 arranged on both sides thereof. The LD bar 1 is mounted on the cooling device 2 in the vicinity of one peripheral side thereof such that a longitudinal direction of the LD bar 1 extends along the peripheral side of the cooling device 2. The cooling devices 2 are connected with one another such that the LD bars 1 thereon are subsequently stacked in a direction perpendicular to longitudinal directions thereof. In using the LD stack 100 as a light source device for pumping a solid-state laser medium of a laser generator, the LD stack 100 is arranged such that the stacking direction, i.e., the direction perpendicular to the longitudinal directions of the DL bars 1, is parallel to a longitudinal direction of the solid-state laser medium.

The LD stack 100 is formed by mechanically connecting the LD modules 5 using the connection plates 3 provided on both sides thereof. The LD stack 100 having the desired number of LD modules is obtained by connecting confronting connection plates 3 of the adjacent LD modules 5.

Any known mechanism can be adopted for connection/disconnection of the confronting connection plates 3. For example, an elastic fitting mechanism for connection by pushing and for disconnection by pulling may be adopted or the connection plates 3 may be connected/disconnected by means of screws.

A sealing member 4 for sealing connecting portion of the adjacent LD modules is arranged between the confronting connection plates 3 so as to prevent leakage of coolant. The sealing member 4 is fitted in the concavities formed on the outer faces of the confronting connection plates 3 to be enclosed by the confronting connection plates 3. The connection plate 3 and the sealing member 4 have openings (a pair of openings in this example) at corresponding positions to jointly serve part of flow passages for coolant when assembled together. The flow passages formed in the adjacent LD modules 5 for supplying/discharging the coolant to/from the cooling devices 2 are connected with each other through the sealing member 4 intervened between the confronting connection plates 3. The housings 6 supporting the cooling devices 2 with the LD bars 1 thereon and the connection plates 3 of the LD modules 5 are continuously connected to define a profile of the LD stack 100.

Figure 2:
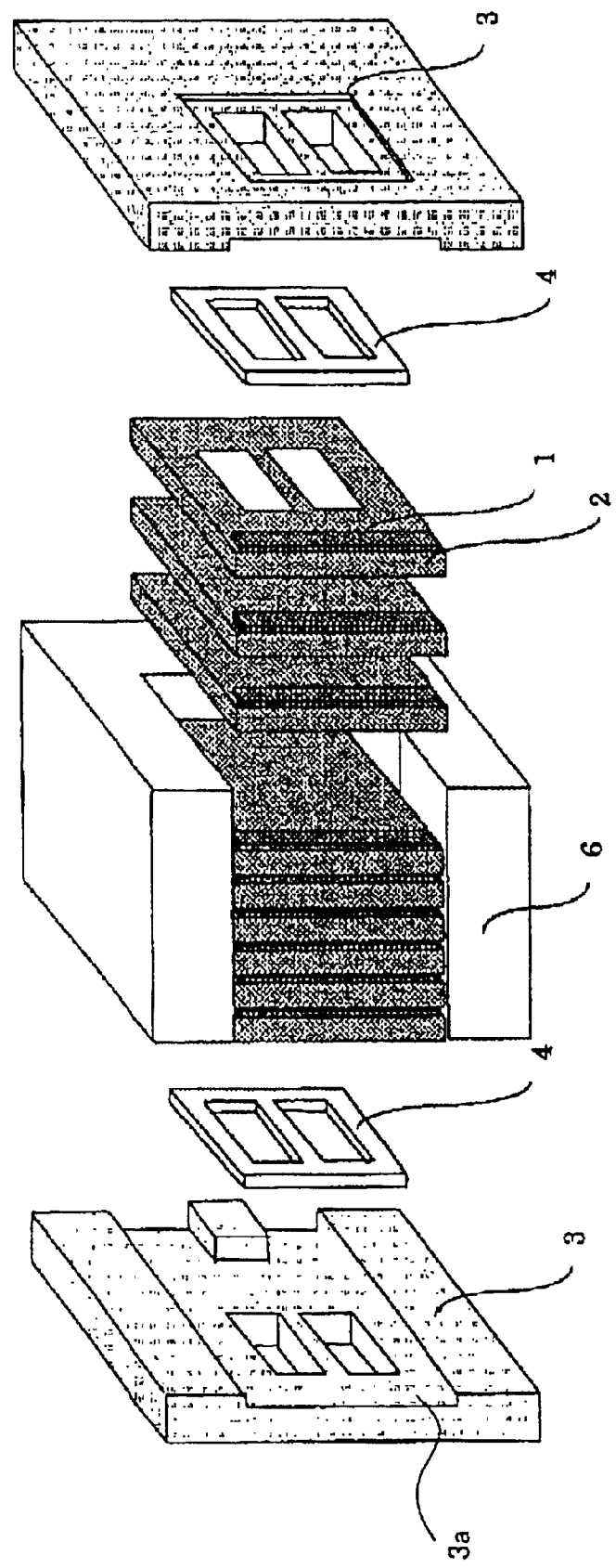
FIG. 2 is an exploded view of one LD module of the LD stack as shown in FIG. 1.

Inner structure of each LD module 5 is shown in the exploded view of FIG. 2. As shown in FIG. 2, the LD module 5 comprises the plurality of cooing devices 2, the LD bars 1 respectively mounted on the cooling devices 2, the housing 6 for holding the cooling devices 2 with LD bars 1, the connection plates 3 and sealing members 4 intervened between the series of the cooling devices 2 and the connection plates 3. Each LD bar 1 is arranged on an associated cooling device 2 to extend along the peripheral side thereof. The cooling devices 2 have openings at approximately central portions thereof to be continuously joined together and connected with the openings formed in the connection plate 3 and the sealing member 4, to form the flow passages for supplying/discharging the coolant to/from the cooling devices 2.

In this example, a concavity 3a corresponding to outer contours of the stacked cooling devices 2 and the sealing member 4 is formed on an inner side of the plate member 3, and at least outermost cooling device 2 with the sealing member 4 is fitted into the concavity 3a of the plate member 3 to be fixedly held by the plate member 3.

The housing 6 may be made of isolating material such as resin and the connection plate 3 may be made of electrically conductive material such as metal, so that the connection plate 3 can be utilized as a conductor for the electric connection between the adjacent LD modules 5.

Figure 3A:
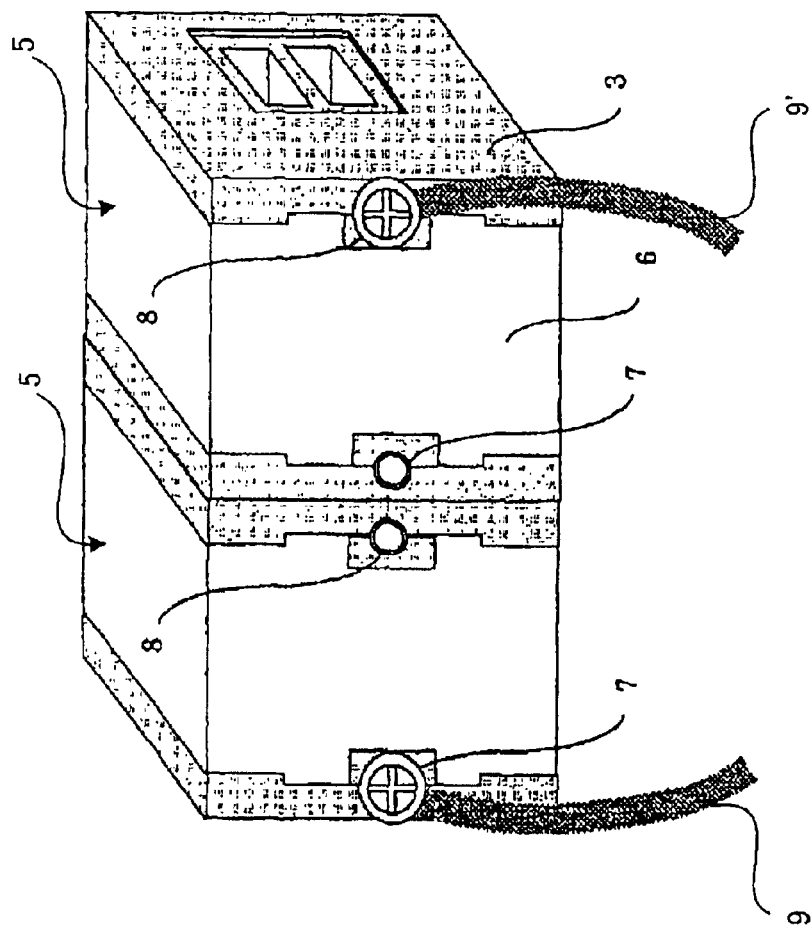
FIG. 3a is a perspective view of an LD stack constituted by one LD module showing electrical connection on back side thereof.
Figure 3B:
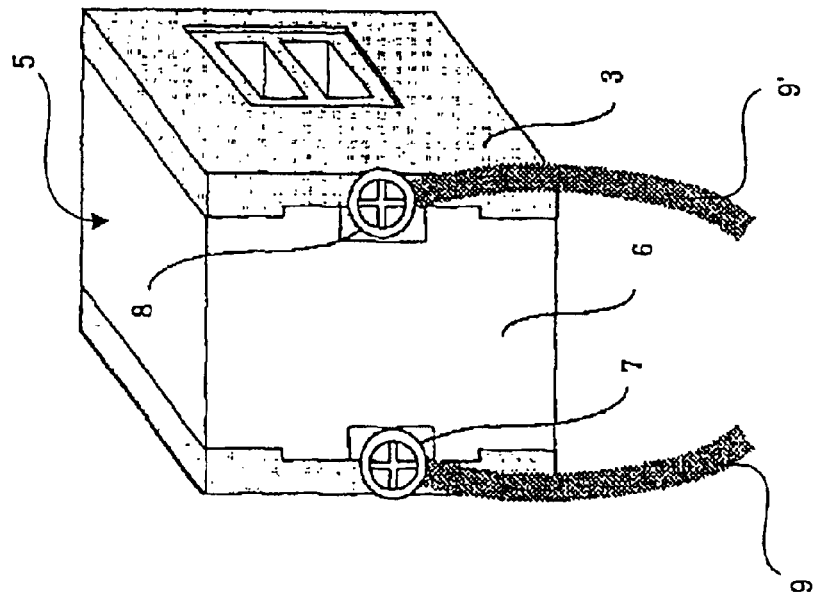
FIG. 3b is a perspective view of an LD stack constituted by two LD modules showing electrical connection on back side thereof.

FIG. 3a shows an electric connection of an LD stack including only one LD module 5 and FIG. 3b shows an electric connection of an LD stack including two LD modules 5, as viewed from a rear of the LD stack.

An positive terminal 7 having a threaded hole for connecting an positive lead 9 and a negative terminal 8 having a threaded hole for connecting a negative lead 9' are formed on a rear side of a connection plate 3 of each LD module 5.

In the case of forming the LD stack by only one LD module 5 as shown in FIG. 3a, the positive lead 9 and the negative lead 9' are connected to the positive terminal 7 and the negative terminal 8, respectively, of the connection plates 3. In the case of forming the LD stack by stacking a plurality of LD modules 5, as shown in FIG. 3b, the positive lead 9 is connected to the positive terminal 7 of an outer connection plate 3 of one outermost LD module 5, and the negative lead 9' is connected to the negative terminal 8 of an outer connection plate 3 of the other outermost LD module 5.

In this example, the LD bars adjacent to each other in the LD module are electrically connected through the cooling devices on which the adjacent LD bars are mounted, and the outermost cooling devices are electrically connected to the connection plates 3 directly by the mechanical connection. Three or more LD modules may be connected one another in the same manner as the two LD modules as shown in FIG. 3b.

Figure 4:
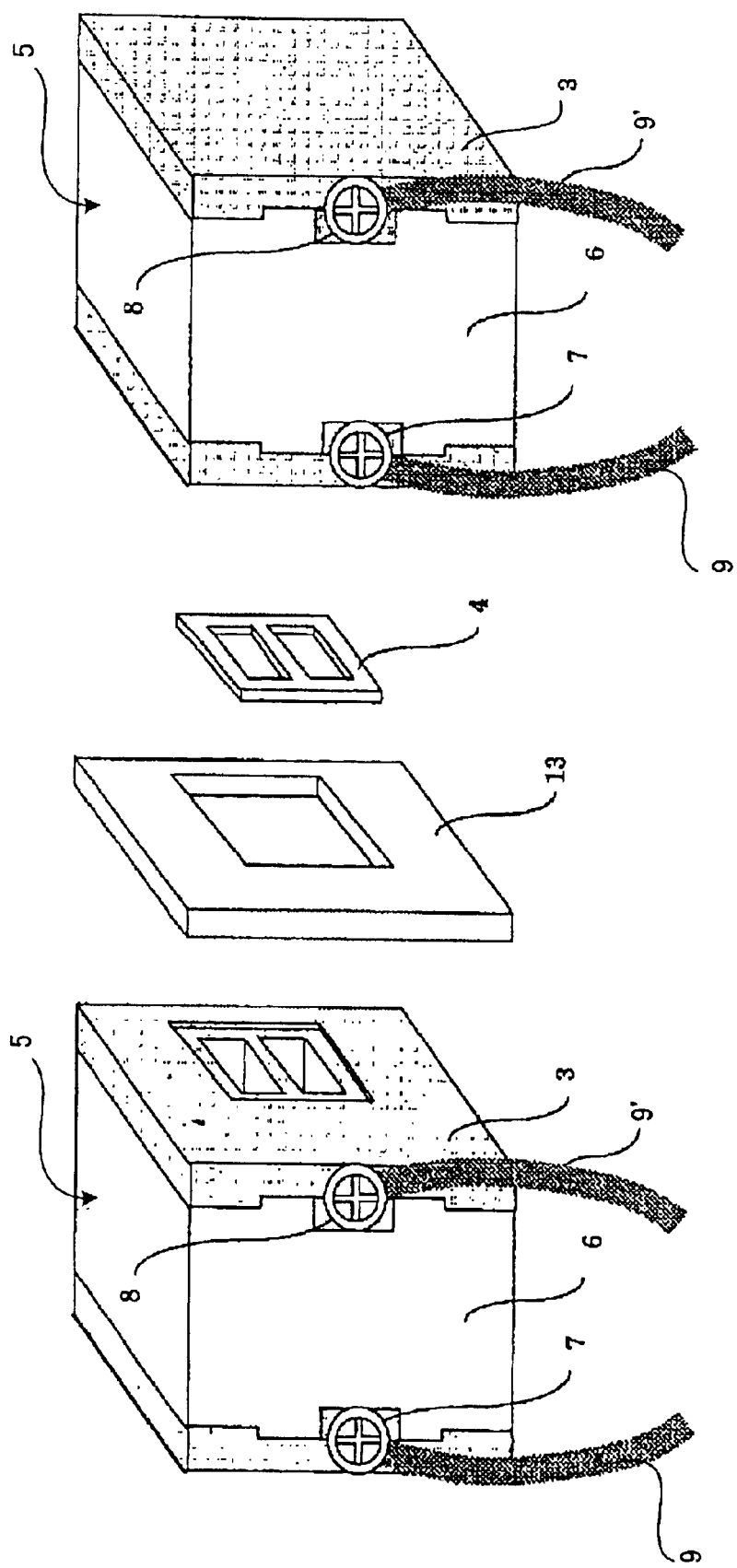
FIG. 4 is an exploded view of a LD stack with adjacent LD modules electrically independent from each other.

The LD modules 5 can be electrically isolated with one another with ease, as shown in FIG. 4. In connecting the LD modules 5, an insulating plate 13 is intervened between the confronting connection plates 3 of the adjacent LD modules 5, so that the adjacent LD modules 5 are electrically isolated. With this arrangement, diagnosing of deterioration of LD bars in the LD module 5 can be easily performed and a LD module including a broken LD bar in the LD stack can be easily specified.

Figure 5:
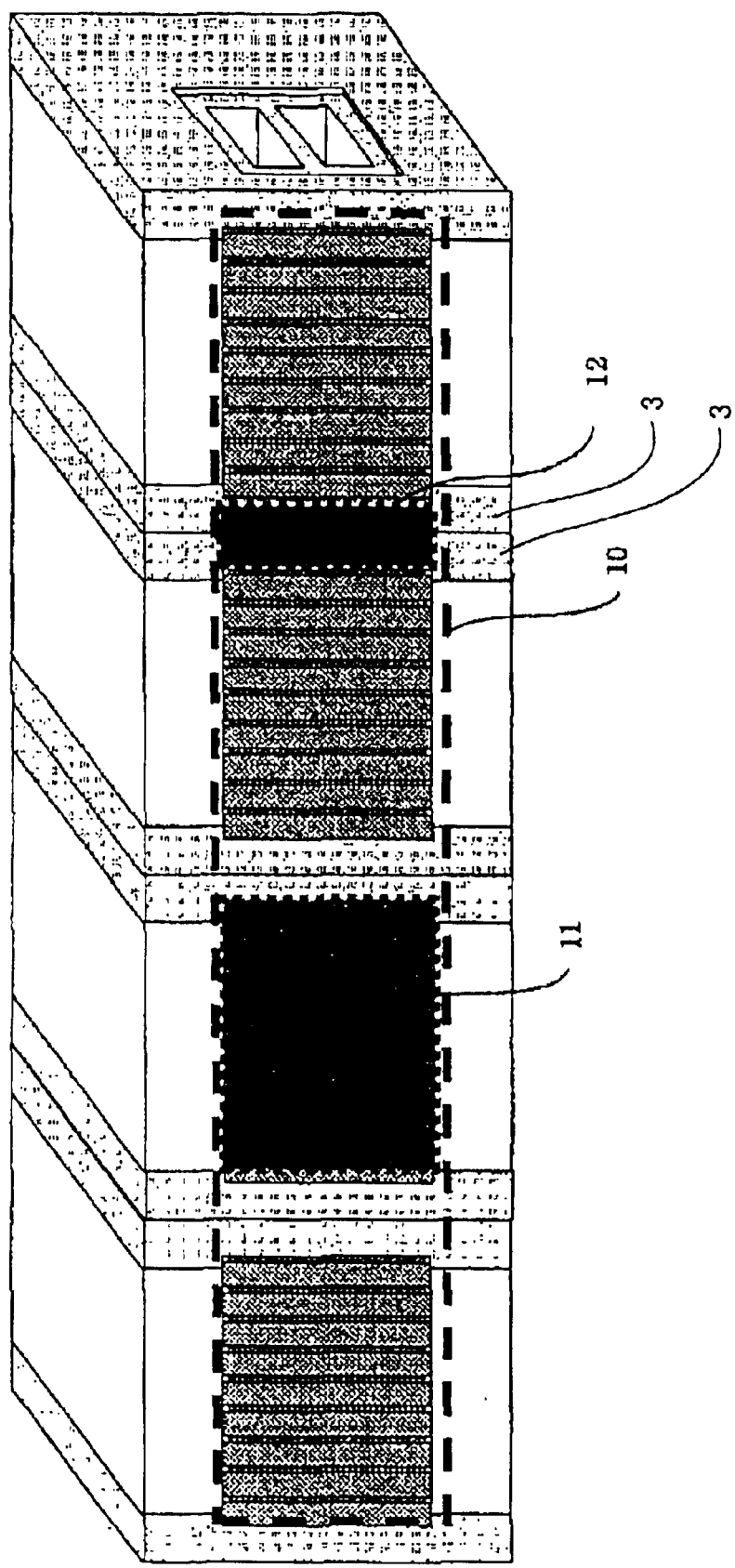
FIG. 5 is a perspective view of a LD stack illustrating an effective emitting region in a whole emitting region.

Evaluation of an effective emitting region of the LD stack will be described referring to FIG. 5. The LD stack shown in FIG. 5 is constituted by four LD modules 5. A rectangle 10 indicated by a thick dotted line represents the smallest rectangle having an area "A" enclosing a whole emitting region of the LD stack. A rectangle 11 indicated by a small dotted line represents the smallest rectangle having an area "B" enclosing an emitting region of each LD module.

The rectangle 10 includes non-emitting regions (dead spaces) 12 formed on side surfaces of the connection plates 3 between the adjacent LD modules and the rectangle 11 does not include the dead space 12. The dead space 12 is determined in dependence on thickness of the connection plates 3 and also depth of the concavities 3a formed in the connection plates 3 in the embodiment as shown in FIG. 2. It is necessary to reduce the thickness of the connection plate 3 and/or increase the depth of the concavities 3a in order to reduce the dead space 12.

An index "1−(NB/A)" is used for evaluating the dead space in the whole emitting region of the LD stack, where N (N≧2) represents the number of LD modules constituting the LD stack, and A, B represent areas of the rectangles 10 and 11, respectively.

It is considered that the smaller a value of the index "1−(NB/A)" is, the larger the effective emitting region of the LD stack is. If the dead space in the whole emitting region is imaginarily "0", a value of "NB" becomes equal to a value of "A" and the value of the index "1−(NB/A)" becomes "0".

It is preferable to arrange the laser diodes and the connection plates in the LD stack such that the above index does not exceed "0.2". Fulfilling this condition, a high density of output power from the emitting surface is secured with small dead spaces to realize a high performance of the LD stack constituted by the LD modules.

According to the present invention, the LD stack is divided into a plurality of LD modules to make assembly of the LD stack easy and prevent leakage of the coolant possibly caused by shortage of pressing pressure on the seal members due to non-uniformity of thickness of the cooling devices. Since the LD modules are mechanically and electrically connected with each other in series including the flow passages of the coolant, the connected LD stack can be treated as a module.

Further, the connected LD stack is used as a surface light-emitting device having a length in accordance with a desired length of a solid-state laser medium with small dead spaces. The connection plates for connecting the LD modules also function as fixture for fixedly supporting the cooling devices in the LD module to simplify the structure of the LD module. The electrical connection between the LD modules can be made independent while the LD modules are connected mechanically, so that diagnose of deterioration of the LD module can be performed.

Furthermore, if a part of the LD stack is broken, the LD stack is repaired by replacing a LD module containing a broken LD with a new LD module to continuously use the LD modules other than the LD module containing the broken LD. Thus, the LD stack is used economically. Since an operation for replacing the LD module in the LD stack is easy performed, the maintenance of the LD stack is made easy.

What is claimed is:

1. A light source device for use in pumping a solid-state laser medium of a laser generator, comprising:
    a plurality of laser diode modules connected in series in a stacking direction to form a laser diode stack, each of said laser diode modules having a plurality of cooling devices for cooling laser diode bars respectively mounted thereon, said cooling devices in said laser diode module being connected with one another in said stacking direction such that said laser diode bars extend perpendicular to said stacking direction, and flow passages for supplying coolant to the cooling devices and discharging coolant from the cooling devices,
    said laser diode modules further having connection plates for mechanically connecting or disconnecting adjacent laser diode modules, and continuously connecting the flow passages formed in the adjacent laser diode modules.

2. A light source device according to claim 1, wherein each of said laser diode modules has the connection plates on both sides thereof to electrically connect the adjacent laser diode modules in series.

3. A light source device according to claim 1, wherein each of said laser diode modules has the connection plates on both sides thereof to fixedly supporting said stacked cooling devices in the laser diode module.

4. A light source device according to claim 1, wherein each of said laser diode modules has the connection plates on both sides thereof, each of said connection plates having a concavity for receiving an outermost cooling device of said stacked cooling devices.

5. A light source device according to claim 1, wherein said laser diodes and said connection plates are arranged in said laser diode stack such that a value of $1-(NB/A)$ does not exceed 0.2, wherein N is an integer not less than two representing the number of LD modules, A is an area of a smallest rectangle enclosing an emitting region of said laser diode stack, and B is an area of a smallest rectangle enclosing an emitting region of each laser diode module.

* * * * *

UNITED STATES PATENT AND TRADEMARK OFFICE
CERTIFICATE OF CORRECTION

PATENT NO. : 6,850,549 B2
DATED : February 1, 2005
INVENTOR(S) : Hiroshi Takigawa et al.

It is certified that error appears in the above-identified patent and that said Letters Patent is hereby corrected as shown below:

Column 1,
Line 48, delete "form" and insert -- from --.

Column 4,
Line 14, delete "form" and insert -- from --;
Line 29, delete "DL" and insert -- LD --.

Column 5,
Line 24, delete "an" and insert -- a --;
Line 43, after "connected" insert -- to --.

Column 6,
Line 48, delete "easy" and insert -- easily --.

Signed and Sealed this

Twenty-first Day of March, 2006

JON W. DUDAS
*Director of the United States Patent and Trademark Office*